(12) United States Patent
Lee et al.

(10) Patent No.: US 6,686,272 B1
(45) Date of Patent: Feb. 3, 2004

(54) ANTI-REFLECTIVE COATINGS FOR USE AT 248 NM AND 193 NM

(75) Inventors: Sang-Yun Lee, Stanford, CA (US); Masaichi Eda, San Jose, CA (US); Hongqiang Lu, Fremont, CA (US); Wei-Jen Hsia, Sunnyvale, CA (US); Wilbur G. Catabay, Saratoga, CA (US); Hiroaki Takikawa, Kanagawa (JP); Yongbae Kim, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/020,084

(22) Filed: Dec. 13, 2001

(51) Int. Cl.$^7$ ........................................... H01L 21/4763
(52) U.S. Cl. ..................... 438/636; 438/637; 438/638; 438/778; 438/931; 438/952
(58) Field of Search ................................. 438/763, 931, 438/952, 778, 72, 633, 634, 629, 636, 637, 638, 643, 783, 786

(56) References Cited

U.S. PATENT DOCUMENTS

| | | | | |
|---|---|---|---|---|
| 5,926,740 A | * | 7/1999 | Forbes et al. ............... | 438/763 |
| 6,376,392 B1 | * | 4/2002 | Lee et al. ................... | 438/778 |
| 2002/0113310 A1 | | 8/2002 | Kim et al. ................... | 257/734 |

OTHER PUBLICATIONS

U.S. Pub 2002/0106891 Kim et al. Method of fabricating semiconductor devices having low dielectric interlayer insulation layer Aug. 8, 2002.*
U.S. Pub. 2002/0106891 Kim et al. Aug. 8, 2002.*
U.S. Pub. 2003/0077916 Xu et al. Apr. 24, 2003.*

* cited by examiner

Primary Examiner—W. David Coleman
Assistant Examiner—Khiem Nguyen
(74) Attorney, Agent, or Firm—Beyer Weaver & Thomas, LLP (57) ABSTRACT

The present invention is directed to a silicon carbide anti-reflective coating (ARC) and a silicon oxycarbide ARC. Another embodiment is directed to a silicon oxycarbide ARC that is treated with oxygen plasma. The invention includes method embodiments for forming silicon carbide layers and silicon oxycarbide layers as ARC's on a semiconductor substrate surface. Particularly, the methods include introducing methyl silane materials into a process chamber where they are ignited as plasma and deposited onto the substrate surface as silicon carbide. Another method includes introducing methyl silane precursor materials with an inert carrier gas into the process chamber with oxygen. These materials are ignited into a plasma, and silicon oxycarbide material is deposited onto the substrate. By regulating the oxygen flow rate, the optical properties of the silicon oxycarbide layer can be adjusted. In another embodiment, the silicon oxycarbide layer can be treated with oxygen plasma.

11 Claims, 5 Drawing Sheets

ANTI-REFLECTIVE COATINGS FOR USE AT 248 NM AND 193 NM

FIELD OF THE INVENTION

The invention described herein relates generally to semiconductor devices and processing. In particular, the present invention relates to methods, materials, and structures used in forming anti-reflective coatings used in photolithographic processes. More particularly, the invention relates to methods, materials, and structures for forming silicon oxycarbide and silicon carbide anti-reflective coatings on a substrate.

BACKGROUND OF THE INVENTION

Conventional methods for defining patterns on wafers include photolithographic technologies. Reticle patterns are projected onto photoresist materials layered on the substrate. After the exposure, the photoresist material is developed and unexposed or exposed portions of the photoresist material are removed to form a pattern, defined by the reticle pattern. This pattern can then be transferred onto the substrate surface. In one common implementation, a patterned photoresist layer serves as an etch mask for etching processes used to form patterns on the underlying surface of the substrate.

As greater and greater circuit densities are sought in semiconductor fabrication, greater pattern definition and resolution are needed in photolithographic techniques. As feature size and critical dimension size continue to shrink, the emphasis on achieving greater photolithographic resolution continues. To achieve these goals, photoresist patterns should be sharp enough to permit the formation of extremely accurate patterns in the underlying photoresist layer.

One approach to defining sharp photoresist patterns involves the formation of a bottom anti-reflective coating (BARC) on the substrate surface, but underneath the photoresist layer. A pattern of increased sharpness can then be formed in the photoresist layer by exposing the photoresist material to light of an appropriate wavelength. During photolithography processes, the underlying BARC absorbs light that is projected toward wafers and reduces reflection from the substrate surface thereby increasing pattern resolution in the photoresist. This, in turn, translates into sharper patterns on the substrate surface.

One commonly used BARC material includes a silicon oxynitride material. For a time, such materials were effective anti-reflective coating (ARC) materials. However, with increased usage of certain low-K dielectric materials, one of the drawbacks of silicon oxynitride became apparent. The nitrogen contained in silicon oxynitride BARC layers "poisons" photoresist layers that contact the BARC. This problem is especially apparent when "aggressive" photoresist materials are used. Examples of such aggressive photoresist materials include, but are not limited to, Acetal photoresists (produced by Sumitomo of Japan) or Escap photoresists (produced by Tokyo Ohka of Japan). Additionally, such silicon oxynitride BARC's have a tendency to leave undesirable particle residues on the substrates.

Additionally, with the need for greater resolution is the need for better "swing curve" performance. A swing curve is a diagram of surface reflectivity (at a chosen wavelength) versus ARC layer thickness. Since surface reflectivity directly impacts the resolution of the photoresist pattern, the swing curve is a measure of resolution versus ARC thickness. In a perfect ARC, the surface reflectivity (resolution) is minimum and constant regardless of the thickness of the ARC layer. Such a curve is a straight horizontal line. For most materials, this is not the case. One of the disadvantages of silicon oxynitride is that its reflectivity is relatively high and its swing curve is not particularly flat. Thus, it is desirable to replace nitrogen-containing ARC materials with other ARC materials. In particular, such ARC materials should be effective at deep ultraviolet (UV) wavelengths, for example, 193 nm (nanometers) and 248 nm.

For the reasons described hereinabove, as well as other reasons, an improved ARC is needed.

SUMMARY OF THE INVENTION

In accordance with the principles of the present invention, a method and structure for an improved ARC are disclosed. One embodiment of the present invention is directed to a silicon oxycarbide anti-reflective coating. Such a coating can be used in conjunction with photolithographic processes using 193 nanometer (nm) wavelength exposure sources. Another embodiment is directed to a silicon oxycarbide anti-reflective coating that is treated with oxygen plasma. Yet another embodiment is directed to a silicon carbide anti-reflective coating. Such a coating can be used in conjunction with photolithographic processes using 248 nanometer (nm) wavelength exposure sources.

A method embodiment for forming an anti-reflective coating on a semiconductor substrate surface comprises depositing the silicon carbide layer on the substrate surface by plasma enhanced chemical vapor deposition. Particularly, the method includes the operations of introducing precursor materials comprising silicon compounds and methyl group containing compounds into a process chamber, where they are ignited as plasma and deposited onto the substrate surface as silicon carbide. Particularly suitable precursor materials include methyl silane materials.

Another method embodiment of forming a silicon oxycarbide anti-reflective coating on a substrate surface is disclosed. The method comprises placing the substrate in a suitable process chamber. Precursor materials including silicon-containing compounds and compounds having methyl groups are introduced with an inert carrier gas into the process chamber. Oxygen is also introduced into the process chamber. These materials are ignited into a plasma, and a silicon oxycarbide material is deposited onto the substrate surface to a desired thickness. As above, particularly suitable precursor materials include methyl silanes, such as tri-methyl silanes and tetra-methyl silanes. By regulating the oxygen flow rate, the optical properties of the silicon oxycarbide layer can be adjusted. In another embodiment, the silicon oxycarbide layer can be treated with oxygen plasma.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various materials and method embodiments for anti-reflective coatings (ARC) will be disclosed. In particular, silicon oxycarbide and silicon carbide ARC's and the methods of their construction will be detailed.

Figure 1:
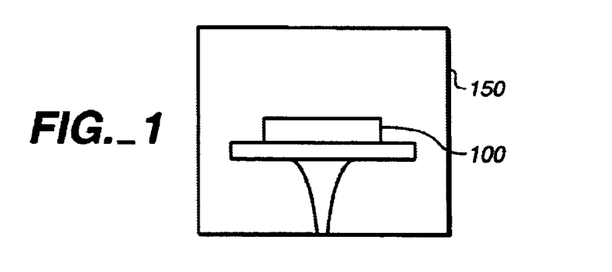
FIG. 1 is a simplified figurative depiction of a semiconductor wafer in a process chamber.

As depicted in FIG. 1, the embodiments begin by first providing a suitable substrate 100 having semiconductor devices and/or structures formed thereon. As used herein, substrate refers to a semiconductor structure. Such structures can include, for example, the bare silicon surfaces of a wafer or any of the surfaces formed thereon. The substrate 100 is then placed in a processing chamber 150 of a process machine. Suitable machines include chemical vapor deposition (CVD) or plasma enhanced chemical vapor deposition (PECVD) machines. Examples of satisfactory machines are Sequels (manufactured by Novellus Systems, Inc. of San Jose, Calif.); Centura 5000 or Producer (manufactured by Applied Materials, Inc. of Santa Clara, Calif.); or Trikon FXP (manufactured by Trikon Technologies, Inc. of the United Kingdom).

Figure 2:
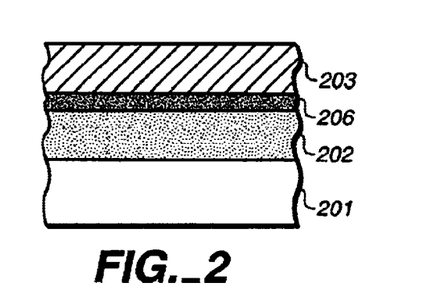
FIG. 2 is a cross-section view of a portion of a semiconductor surface having a layer of conducting material, a barrier layer, and a layer of insulating material formed thereon, all in readiness for the formation of an ARC in accordance with the principles of the present invention.

One example of a typical substrate 100 is shown in FIG. 2. FIG. 2 is a cross-section view of a portion of the surface of the substrate. The depicted substrate has a semiconductor surface 201 having a conducting layer 202 formed thereon. In one example, the conducting layer 202 comprises a copper-containing material. Many other conductive materials can be used including, but not limited to, aluminum, tungsten, and a variety of alloy materials. Such conducting layers 202 can be formed using a wide range of techniques known to those having ordinary skill in the art. Such techniques can include, but are not limited to, single and double damascene processes. Where the conducting layer 202 comprises a copper-containing material, at least one barrier layer 206 is formed between the copper-containing material 202 and a subsequently formed insulating layer 203. The details of such barrier layers 206 are not critical to the practicing of the invention. However, such a barrier layer 206 can include a plurality of barrier layers and can be formed of a variety of barrier materials. Example materials include, but are not limited to, tantalum, tantalum nitrides, and tantalum silicon nitrides (TaSiN). Alternatively, other materials such as Ti or TiN can be used. Suitable barrier layers 206 are in the range of about 20 to 300 Ångstroms (Å) thick. Such barrier layers can be comprised of many other materials or combinations of material known to those having ordinary skill in the art.

An insulating layer 203, comprised of an electrically insulating material, is formed on the substrate surface. Commonly, the insulating layer 203 is formed directly on the barrier layer 206. However, in some embodiments the insulating layer 203 is formed on the conducting layer 202. Commonly, the insulating layer 203 is formed of dielectric materials. Such dielectric material can be silicon dioxide; however, combinations of silicon dioxide and other doped dielectrics (e.g., BPSG, PSG) are also commonly used. Additionally, low-K dielectric materials or other electrically isolating materials are also used. The principles of the present invention find particular utility when applied to use with low-K dielectric materials. Examples include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquino-xalines, polyquinolines; inorganic and spin-on glass materials such as silsesquioxanes, silicates, and siloxanes; and, mixtures, or blends, of organic polymers and spin-on glasses. Further, examples of CVD low-K materials include polymers of parylene and napthalene, copolymers of parylene with polysiloxanes or teflon, and polymers of polysiloxane. This list of materials is not intended to be exhaustive but rather illustrative. It is to be noted that the ARC's of the present invention have wide application to all manner of semiconductor surfaces and structures beyond those illustrated herein.

Figure 3:
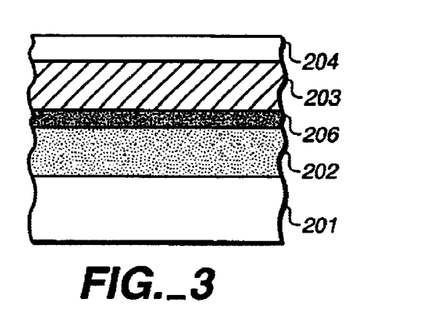
FIG. 3 is a cross-section view of the substrate shown in FIG. 2 depicting an ARC layer formed on the substrate surface in accordance with the principles of the present invention.

In accordance with one embodiment of the present invention, and with respect to FIG. 3, a silicon oxycarbide layer 204 is formed on the surface to be etched (here, the insulating layer 203). Silicon oxycarbide, for purposes of this patent, is a generic name given to a class of materials comprising $Si_xO_yC_z$. The following discussion is directed toward methods of forming such layers. In one suitable process, a substrate 100 is positioned in a processing chamber 150 (See, FIG. 1). One example of a satisfactory machine is a Trikon FXP machine. Once the substrate is positioned in the chamber, appropriate reactant materials are flowed into the chamber 150. Such materials comprise precursor materials such as silicon-containing materials and methylated materials. Nitrogen-containing materials are to be avoided. A preferred class of precursor materials is methyl silanes. The most preferred examples are 4-methylsilane ($Si(CH)_4$, also known as 4MS), 3-methylsilane ($Si(CH)_3H$, also known as 3MS), 2-methylsilane ($Si(CH)_2H_2$, also known as 2MS), and also 1-methylsilane ($Si(CH)H_3$, also known as 1MS). In one exemplar process, precursor materials are flowed into the process chamber with an inert carrier gas (e.g., argon (Ar) or helium (He)). Additionally, another reactant, oxygen ($O_2$) gas is flowed into the chamber. For example, $Si(CH)_3H$ (3MS) is flowed into the chamber with an Ar carrier gas while $O_2$ gas is flowed into the chamber. In one preferred embodiment, the 3MS is flowed into the chamber at a rate of about 400 SCCM (standard cubic centimeter per minute) with an Ar carrier gas flow rate of about 1500 SCCM. The forgoing embodiment is but one preferred implementation. Methyl silane flow rates can range from about 100 SCCM to about 1000 SCCM. Carrier gas flow rates can range from about 500 SCCM to about 3000 SCCM. Additionally, $O_2$ gas flow rates can range from about 10 SCCM to about 100 SCCM, with one preferred flow rate being about 50 SCCM. By adjusting the $O_2$ flow rate, the optical properties of a resulting ARC can be controlled. This will be discussed in greater detail hereinbelow.

As the materials are flowed into the process chamber, a pressure in the range of about 2–10 Torr, preferably about 6 Torr is maintained. A plasma is then ignited in the chamber. Plasma ignition power ranges from about 200 watts (W) to about 600 W. A preferred power being about 300 W. After plasma ignition, a silicon oxycarbide layer can be formed to a desired thickness. Typical thicknesses being in the range of about 100 Å (Angstroms) to about 1000 Å, with one preferred thickness being about 600 Å. Deposition rates can vary depending on oxygen content. ARC films having higher oxygen concentrations deposit more quickly than ARC films having lower oxygen concentrations. One typical process takes about 30 seconds to deposit a silicon oxycarbide layer to about 600 Å.

An important aspect of the invention is the ability to adjust the optical properties of the silicon oxycarbide layer by altering the oxygen flow rate. Relevant optical properties in an ARC layer include, among others, effective wavelength (the wavelength at which the ARC will be effective), refractive index (n), and extinction coefficient (k). For example, if no $O_2$ is introduced, a silicon carbide ARC layer will be formed. Such a silicon carbide (SiC) material is an effective ARC at 248 nm, but less effective at 193 nm. The uses and methods of forming silicon carbide layers will be discussed in later paragraphs. Also, as the oxygen flow rate is increased, the n and k of the resulting silicon oxycarbide layer is reduced. Silicon oxycarbide layers are effective ARC's at 193 nm. Also, adding oxygen to silicon carbide films reduces the surface reflectivity of the resulting silicon oxycarbide films. This behavior can be illustrated with reference to so-called "swing curves".

Figure 4:
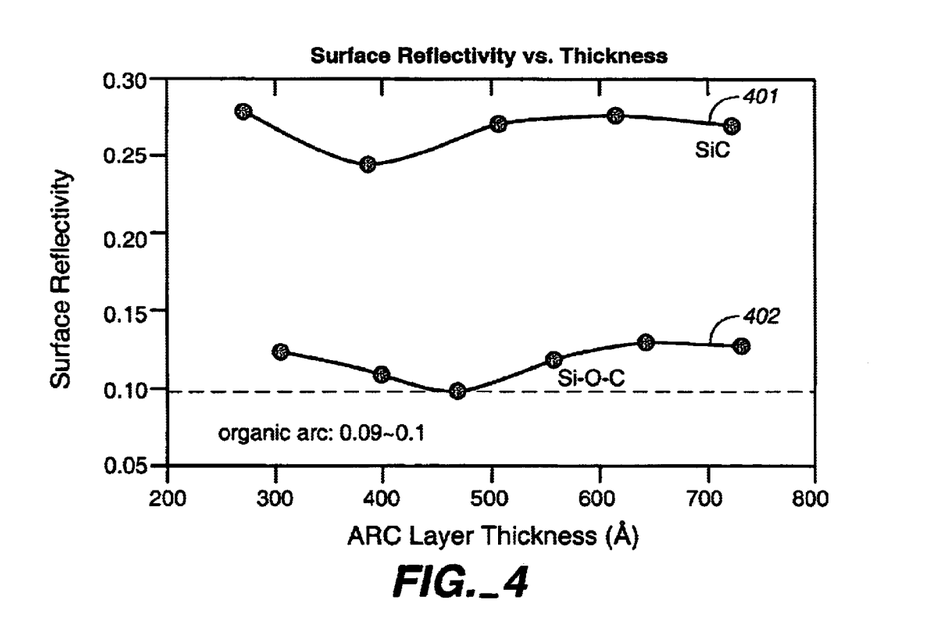
FIG. 4 is graphic depiction of a "swing curve" for silicon carbide and silicon oxycarbide ARC films constructed in accordance with the principles of the present invention.

FIG. 4 is a swing curve illustrating the relationship between ARC layer thickness (the x-axis) and surface reflectivity of the ARC coating (y-axis). These swing curves vary depending on the reflectivity of the underlying materials. Here, the swing curves are generated by ARC layers 500 Å thick. These ARC layers are formed on an underlying dielectric material 7,500 Å thick. The swing curve diagram of FIG. 4 depicts a silicon carbide film 401 and a silicon oxycarbide film 402. It can be seen that the surface reflectivity of a silicon carbide film 401 can be reduced from about 0.25 to about 0.1 by introducing oxygen into the film. The depicted silicon oxycarbide film 402 is formed using an $O_2$ flow rate of about 50 SCCM. The silicon oxycarbide ARC 402 will have an n of about 1.5 and a k of about 0.06 with a surface reflectivity of about 0.1 at 193 nm. By increasing the oxygen flow rate, the refractive index (n) can be reduced, and decreasing the oxygen flow rate results in a film having a higher refractive index. The specific reflectivity, n, and k, of the ARC coating also depends on the optical properties of the underlying layers. The desired values of these parameters can be determined and adjusted by process engineers in accordance with the principles known to those having ordinary skill in the art.

In the depicted embodiments, the conducting layer 202 is an interconnect structure covered with an insulating layer 203 comprised of low-K dielectric material. However, it should be noted that the disclosed ARC layers have broad applicability and are not limited to use with low-K dielectric materials. The ARC layers disclosed herein can be used over any type of material including, but not limited to metallization layers, oxide regions, dielectric layers, or any other type of semiconductor surface material.

Figure 5A:
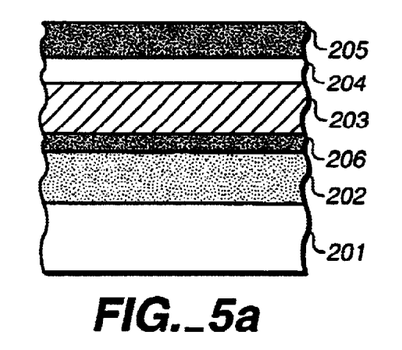
FIGS. 5(a)–5(c) are cross-section views of a portion of a substrate surface having a photoresist layer formed and patterned over the ARC layer of the invention, and showing an etched structure.
Figure 5B:
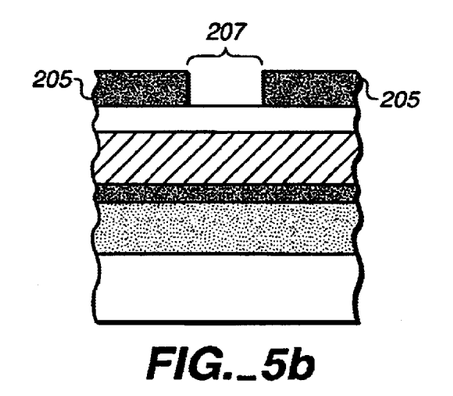

FIGS. 5(a) and 5(b) show a portion of a substrate surface. In the depicted embodiment, the substrate 201 has a conducting layer 202 having a barrier layer 206 formed thereon. Over the barrier layer 206 is a dielectric layer 203. An ARC layer 204 constructed in accordance with the principles of the present invention is formed thereon. A photoresist material 205 is then layered onto the ARC layer 204.

Figure 5C:
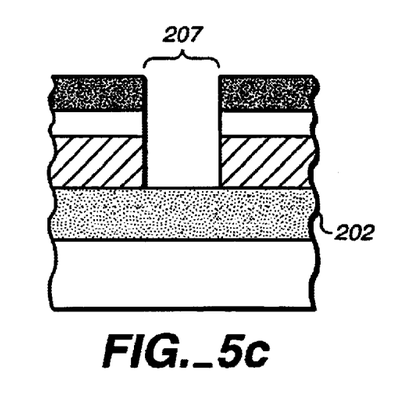

FIG. 5(b) shows a portion of a semiconductor substrate surface where the photoresist material 205 has been exposed and developed in accordance with, for example, a mask pattern. The photoresist then has a pattern having openings 207 therein. FIG. 5(c) shows the results of etching through the opening 207 down to the conducting layer 202. Thus, FIGS. 5(a)–5(c) illustrate one application of a silicon oxycarbide film layer 204 used as a 193 nm ARC.

Silicon oxycarbide film layers 204 (for example, those described hereinabove with respect to FIG. 3) can be plasma treated to increase robustness. Such treatment comprises exposing the silicon oxycarbide film layer 204 to an oxygen plasma. Such treatment can be accomplished using an ashing machine, such as an ENVIRO™ Advanced Dry Strip System manufactured by ULVAC Technologies of Japan.

Figure 6:
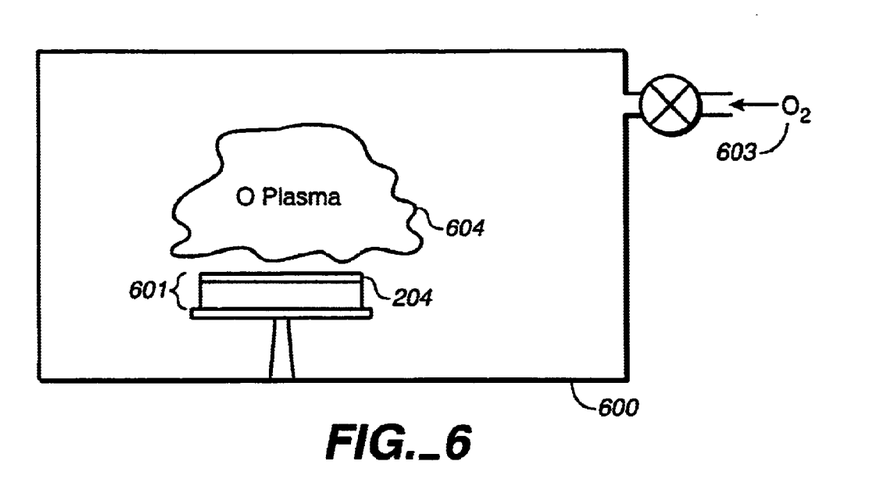
FIG. 6 is a simplified figurative depiction of a semiconductor wafer in a process chamber. The semiconductor wafer is depicted having an ARC layer undergoing oxygen plasma treatment in accordance with the principles of the present invention.

Referring to FIG. 6, a substrate 601 having a silicon oxycarbide ARC layer 204 is placed in an appropriate process chamber 600. The silicon oxycarbide ARC layer 204 can be formed in a manner as described hereinabove. In order to plasma treat the ARC layer 204, oxygen gas 603 is flowed into the chamber 600 at flow rates ranging from about 50 SCCM to about 3000 SCCM. In one preferred implementation, an oxygen flow rate of about 500 SCCM is used. The chamber temperature is in the range of about −20° C. to about 100° C., with room temperature being preferred. Plasma 604 is then ignited in the chamber using a power in the range of about 100 W to about 3000 W, preferably 400 W. This oxygen plasma 604 reacts with the silicon oxycarbide ARC layer 204 to form a more robust 193 nm ARC layer. The silicon oxycarbide ARC layer 204 is plasma treated for about 25 to about 120 seconds, with 70 to 90 seconds being preferred. A photoresist layer can then be formed on the plasma treated ARC layer 204 and used to etch sharply defined patterns in the substrate surface.

Figure 7:
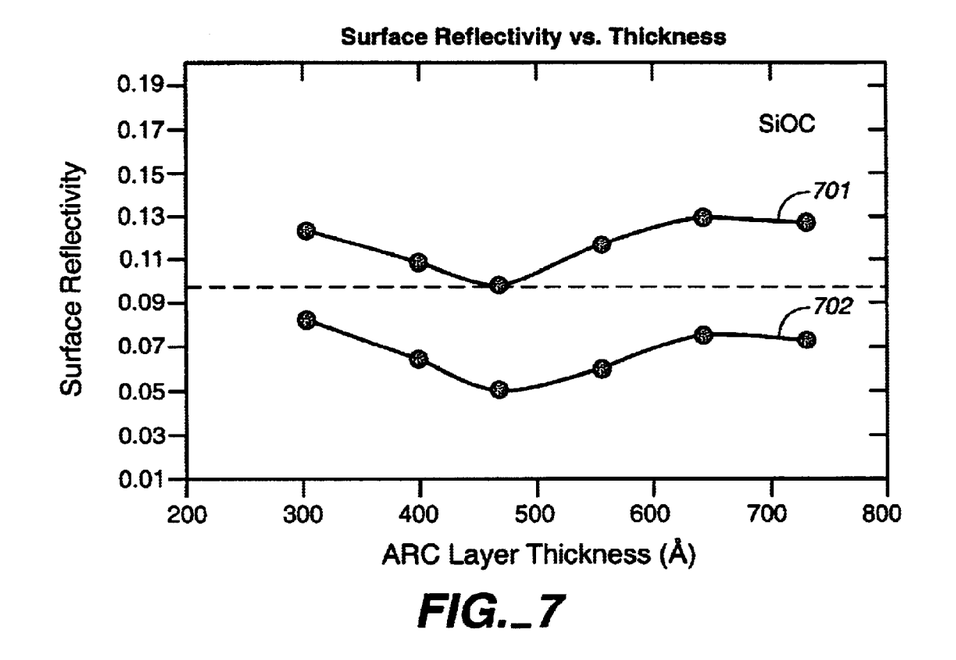
FIG. 7 is graphic depiction of a sample "swing curve" for a silicon oxycarbide ARC film, and a silicon oxycarbide ARC film after oxygen plasma treatment in accordance with one embodiment of the present invention.

Reference to FIG. 7 shows a comparison between the "swing curves" of a silicon oxycarbide ARC layer 701 and a plasma treated silicon oxycarbide ARC layer 702. As with the swing curve of FIG. 4, the ARC layers are formed 500 Å thick on a dielectric layer 7,500 Å thick. It is to be noted that treating with oxygen plasma reduces the surface reflectivity of the ARC film.

Yet another ARC embodiment of the present invention includes ARC layers formed of silicon carbide. Such embodiments are particularly effective as ARC's for use with 248 nm exposure sources. As with silicon oxycarbide ARC's, such ARC embodiments can be formed on any semiconductor substrate. One example of a suitable substrate is described with respect to FIG. 2. The depicted substrate has a semiconductor surface 201 having a conducting layer 202 formed thereon. The depicted conducting layer 202 comprises a copper-containing material. At least one barrier layer 206 is formed on the conducting layer 202. An insulating layer 203 is formed on the barrier layer 206. A silicon carbide layer 204 is then formed on the surface (here, the insulating layer 203). Silicon carbide, for purposes of this patent, is a generic name given to a class of materials comprising $Si_xC_y$. The following discussion is directed toward methods of forming such layers. With reference to FIG. 1, a substrate 100 is positioned in a processing chamber 150. Again a Trikon FXP machine is a suitable example. Reactant materials are flowed into the chamber 150. As discussed previously, such materials can include precursor materials such as silicon-containing materials and methylated materials.

Nitrogen-containing materials are to be avoided. A preferred class of precursor materials includes methyl silanes such as 4MS, 3MS, 2MS, and 1MS. In one exemplar process, precursor materials are flowed into the process chamber with an inert carrier gas (e.g., argon (Ar) or helium (He)). In one example, 3MS is flowed into the chamber at a rate of about 400 SCCM (standard cubic centimeter per minute) with an Ar carrier gas flow rate of about 1500 SCCM. As with the above embodiments a wide range of methyl silane flow rates and carrier gas flow rates can be used. For example, methyl silane flow rates can range from about 100 SCCM to about 1000 SCCM. Carrier gas flow rates can range from about 500 SCCM to about 3000 SCCM. The reactant materials are flowed into the process chamber to a pressure in the range of about 2–10 Torr, preferably about 6 Torr. A plasma is then ignited. Plasma ignition powers range from about 200 watts (W) to about 600 W. A preferred power being about 300 W. After plasma ignition, a silicon carbide layer can be formed to a desired thickness. Typical thicknesses being in the range of about 100 Å (Angstroms) to about 1000 Å, with one preferred thickness being about 600 Å. Such silicon carbide layers are effective ARC's at 248 nm. Over such a silicon carbide ARC layer, a photoresist layer can be formed and patterned in accordance with processes and methods known to persons having ordinary skill in the art.

Figure 8:
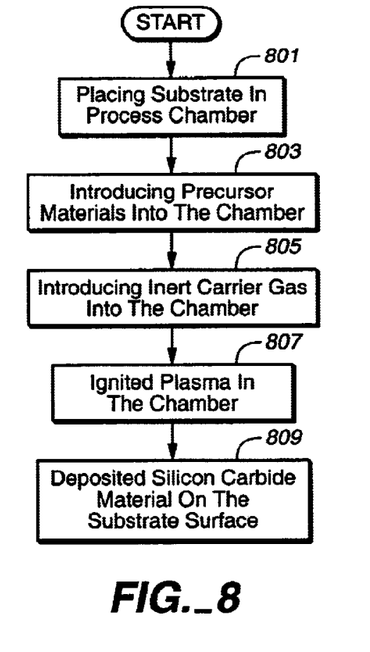
FIGS. 8 and 9 are flow diagrams illustrating method embodiments for practicing the principles of the present invention.

Referring to FIG. 8, a flow diagram of one embodiment of forming a silicon carbide antireflective coating on the substrate surface is depicted. Typically, such processes begin by placing an appropriately prepared substrate in a suitable process chamber 801. Typical examples include CVD and PECVD process chambers. Once the substrate is positioned in the chamber, silicon-containing compounds and compounds having methyl groups as precursor materials are flowed into the chamber 803. As explained previously, such materials typically comprise methyl silane materials and are typically accompanied by an inert carrier gas such as He or Ar (805). A plasma is then ignited in the chamber 807. A silicon carbide material is then deposited on the substrate surface to a desired thickness 809.

Figure 9:
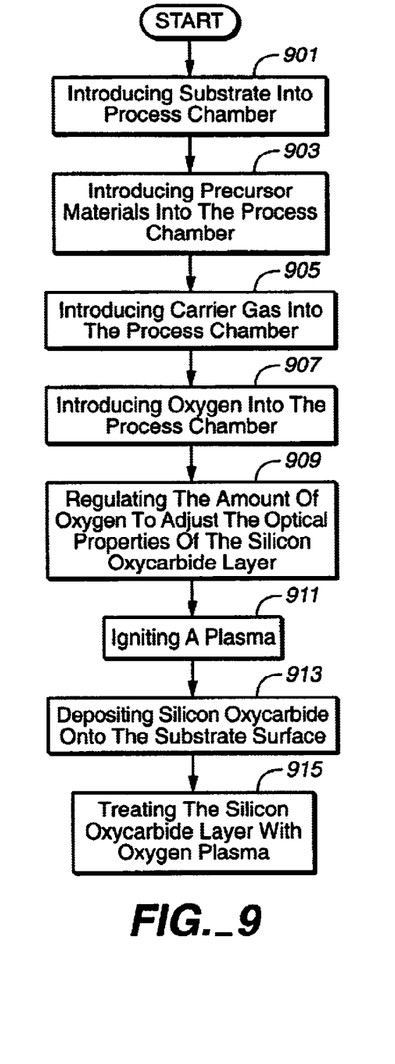

With reference to FIG. 9, a flow diagram of another embodiment describes a method of forming a silicon oxycarbide anti-reflective coating on a substrate surface. Such a method begins by introducing an appropriately prepared substrate to suitable process chamber 901. Precursor materials are introduced into the process chamber 903. As discussed, such materials comprise silicon-containing compounds and compounds having methyl groups (e.g., methylsilanes). Inert carrier gas is introduced into the process chamber 905. Oxygen is introduced into the chamber 907. The amount of oxygen is regulated to adjust the optical properties of the silicon oxycarbide layer 909. These materials are ignited into a plasma 911. Silicon oxycarbide material is then deposited onto the substrate surface to a desired thickness 913. In another related embodiment, the robustness of the silicon oxycarbide layer can be enhanced by treating the silicon oxycarbide layer with oxygen plasma 915.

Figure 10:
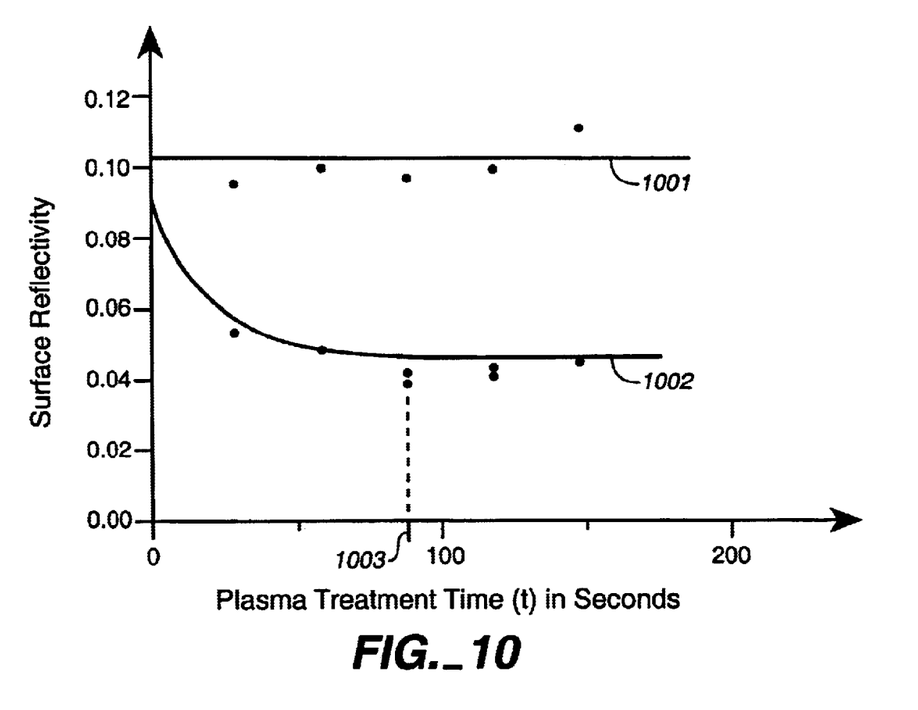
FIG. 10 graphically depicts a relationship between an untreated SiOC ARC layer and a SiOC ARC layer treated with oxygen plasma.

FIG. 10 is a graphical depiction of the relationship between a deposited SiOC ARC layer 1001 and a SiOC ARC layer that has been subjected to an oxygen plasma treatment 1002. The depicted ARC layers are formed to about 500 Å thick on a 7500 Å thick dielectric layer (e.g., Black Diamond). FIG. 10 depicts some experimental results showing the reduced reflectivity obtained using plasma treatment. An example of such plasma treatment is disclosed in the discussions concerning, for example, FIG. 6. As depicted the plasma treated ARC layer 1002 has a significantly reduced surface reflectivity when compared to an ordinary SiOC ARC layer 1001. As is readily apparent, this is an advantageous feature in an ARC film. FIG. 10 shows that, up to a point, the longer the plasma treatment the less surface reflectivity the ARC film has. Typically, an ordinary oxygen plasma treatment process or ashing process, as is known to persons having ordinary skill in the art, is effective to treat the SiOC ARC layer. Generally, a ninety (90) second plasma treatment 1003 attains a maximized reduction in surface reflectivity of the example ARC layer. Additionally, such plasma treated ARC layers are more robust than untreated layers. As stated previously, both ARC layers 1001, 1002 have the advantage of not having nitrogen in the ARC layer. Therefore neither layer demonstrates the detrimental effects common with nitrogen containing ARC films.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that anti-reflective coating layers disclosed herein can be practiced with a number of different materials. These anti-reflective coating layers can be formed on dielectric materials, insulating structures, conductive materials, metallization layers and many other materials. Further, reference in the claims to an element in the singular is not intended to mean "one and only one" unless explicitly stated, but rather, "one or more".

What is claimed is:

1. A method of photolithographically patterning a layer on a semiconductor substrate, the method comprising;
providing a semiconductor substrate having formed thereon a layer of electrically insulating material;
forming a silicon oxycarbide anti-reflective layer on the layer of electrically insulating material wherein forming the anti-reflective layer includes forming a silicon oxycarbide layer, and after the formation of the silicon oxycarbide layer, plasma treating the silicon oxycarbide layer with a plasma consisting essentially of oxygen plasma to decrease the surface reflectivity of the resulting silicon oxycarbide anti-reflective layer;

forming a layer of photoresist material on the silicon oxycarbide anti-reflective layer;

photolithographically exposing and developing the layer of photoresist material to form a mask pattern in the photoresist material; and etching through the silicon oxycarbide anti-reflective layer and through the underlying at least one layer of electrically insulating material to form a pattern in the underlying layer of electrically insulating material.

2. The method of claim 1 wherein the layer of electrically insulating material includes low-K dielectric materials.

3. The method of claim 1 wherein the silicon oxycarbide anti-reflective layer is effective as an anti-reflective coating for 193 nm (nanometer) photolithography processes.

4. The method of claim 1 wherein the silicon oxycarbide anti-reflective layer is effective as an anti-reflective coating for 248 nm (nanometer) photolithography processes.

5. The method of claim 1 wherein forming a silicon oxycarbide anti-reflective layer includes the operation of adjusting the optical properties of the silicon oxycarbide anti-reflective layer.

6. The method of claim 5 wherein adjusting the optical properties of the silicon oxycarbide anti-reflective layer includes regulating an amount of oxygen used in the formation of the silicon oxycarbide anti-reflective layer thereby adjusting the optical properties of the silicon oxycarbide layer.

7. The method of claim 5, wherein the operation of adjusting amount of oxygen used in the formation of the silicon oxycarbide anti-reflective layer comprises regulating the amount of oxygen to adjust at least one of the refractive index (n), absorption coefficient (k), the wavelength, and the surface reflectivity of the silicon oxycarbide layer to desired levels.

8. The method of claim 1 wherein the operation of plasma treating plasma treating the silicon oxycarbide layer with a plasma consisting essentially of oxygen plasma to decrease the surface reflectivity of the resulting silicon oxycarbide anti-reflective layer includes adjusting the optical properties of the silicon oxycarbide anti-reflective layer by plasma treating the silicon oxycarbide anti-reflective layer to adjust the optical properties of the silicon oxycarbide anti-reflective layer.

9. The method of claim 8, wherein plasma treating the silicon oxycarbide anti-reflective layer includes plasma treating the silicon oxycarbide layer in the absence of nitrogen.

10. The method of claim 8 wherein the silicon oxycarbide anti-reflective layer is effective as an anti-reflective coating for 193 nm (nanometer) photolithography processes.

11. The method of claim 8 wherein the silicon oxycarbide anti-reflective layer is effective as an anti-reflective coating for 248 nm (nanometer) photolithography processes.

* * * * *